United States Patent [19]

Miyase et al.

[11] Patent Number: 5,709,927
[45] Date of Patent: Jan. 20, 1998

[54] THICK FILM CIRCUIT BOARD

[75] Inventors: Yoshiyuki Miyase, Okazaki; Tohru Nomura, Kariya; Akihiko Naito; Takamasa Okumura, both of Nagoya, all of Japan

[73] Assignees: Nippondenso Co., Ltd., Kariya; Sumitomo Metal Ceramics Inc., Mine, both of Japan

[21] Appl. No.: 623,836

[22] Filed: Mar. 29, 1996

[30] Foreign Application Priority Data

Mar. 31, 1995 [JP] Japan .................................. 7-076337

[51] Int. Cl.$^6$ .................................................. B32B 9/00
[52] U.S. Cl. .................. 428/209; 428/210; 428/688; 428/901
[58] Field of Search ................................ 428/209, 210, 428/901, 688; 257/750; 427/103

[56] References Cited

U.S. PATENT DOCUMENTS

| | | | |
|---|---|---|---|
| 4,728,534 | 3/1988 | Ho | 427/103 |
| 5,016,089 | 5/1991 | Fujii | 257/750 |
| 5,204,166 | 4/1993 | Ito | 428/901 |

FOREIGN PATENT DOCUMENTS 2-166787  6/1990  Japan .

*Primary Examiner*—Patrick Ryan
*Attorney, Agent, or Firm*—Cushman, Darby & Cushman IP Group of Pillsbury Madison & Sutro LLP

[57] ABSTRACT

A thick film circuit board comprising an insulating substrate; conductor wiring layers of a conductive material containing an oxide and formed on the insulating substrate by printing and firing; a resistance layer of a resistive material having a selected sheet resistance, being chemically reactive with the oxide, and formed between and bridging the conductor wiring layers by printing and firing; and a conductive barrier layer interposed between each of the conductor wiring layers and the resistance layer to prevent chemical reaction between the oxide of the conductor wiring layers and the resistive material of the resistance layer.

14 Claims, 6 Drawing Sheets

THICK FILM CIRCUIT BOARD

BACKGROUND OF THE INVENTION

1. Field of the Invention

The present invention relates to a thick film circuit board having an insulating substrate on which conductor wiring layers and resistance layers are formed by printing and firing, particularly to a thick film circuit board having an improved thick film structure providing an improved quality.

2. Description of the Related Art

The thick film circuit board applicable for IC igniters and IC regulators, for example, is usually produced by forming conductor wiring layers on a ceramic substrate of alumina, aluminum nitride, etc., by printing and firing, and forming a resistance layer of a resistive material having a desired sheet resistance between the conductor wiring layers.

In recent years, there has been an increasing need for a miniaturized thick film circuit board applicable to elevated temperature applications. To this end, there has arisen a general trend to use a copper conductor as a material for a thick film conductor wiring and a lanthanum boride ($LaB_6$)-based material as a material for a thick film resistance layer, because these materials make it possible to form a fine line and high density circuit having a good bond strength which is not lost at elevated temperatures and providing a high temperature endurance.

The present inventors have found that, when a lanthanum boride-based resistive material having, for example, a low sheet resistance of about from $10\Omega$/square to $50\Omega$/square is used to form a thick film resistance layer, cracking occurs in a conductor wiring layer of a copper conductive material. This is due to the fact that the lanthanum boride-based resistive material having such a low sheet resistance as described above contains a small amount of a conductive component, that lanthanum boride has a reducing effect, and that the copper conductive material contains copper oxide (CuO) and other oxides.

More specifically, the cracking of the copper conductor layer is thought to occur by the following mechanism:

(1) When the resistive material printed on the copper conductive material is fired, CuO and other oxides in the copper conductive material are reduced by the reducing effect of lanthanum boride ($LAB_6$).

(2) During this reduction process, the oxides rapidly diffuse from a boundary portion of the copper conductive material which is engaged with the peripheral portion of the resistive material, i.e., from a portion on which the resistive material, which reacts with the oxides to be reduced, is not present, toward a portion of the conductive material on which the resistive material is present. Namely, the oxides rapidly diffuse from a portion of the conductive material where the oxides remain unreduced in a large amount toward a portion of the conductive material in which the oxide amount is decreased by the reduction reaction.

(3) This rapid diffusion forms a Kirkendall void at the portion from which the oxides diffuse, and plural voids are coalesced to form a crack.

The occurrence of the cracking in the conductive material may also cause electrical disconnection, which leads to failure in providing the required performance of the thick film circuit board, and more importantly, a significant reduction in the production yield.

The present inventors have also found that, when a thick film resistance layer is formed of a lanthanum boride-based resistive material having a high sheet resistance, for example, 5 to 6 $k\Omega$/square or more, the thus-obtained sheet resistance has too large a fluctuation to be applied to practical use. This is thought to be because a lanthanum boride-based resistive material having a high sheet resistance contains a small amount of the conductive component $LaB_6$ and because the conductive component $LaB_6$ reduces the oxides in the copper conductive material to produce an insulating glass phase. Namely, both a fluctuation of the decrease in the amount of the conductive component due to the reducing reaction and a fluctuation of the amount of the produced glass phase influence the sheet resistance more significantly in a more resistive material than in a less resistive material, because the former contains a smaller amount of the conductive component than the latter.

Thus, a thick film resistance layer having a large fluctuation in resistance also fails to provide a required performance of the thick film circuit board and causes a significant reduction in the production yield.

As described above, both a lanthanum boride-based resistive material having a low sheet resistance of about 10 to $50\Omega$/square, and one having a high sheet resistance of about 5 to 6 $k\Omega$/square or more have problems of cracking and fluctuation in resistance, respectively. These problems could be solved if a resistive material having an intermediate sheet resistance and a different dimension were used to provide a required resistance value, specifically, if either a resistive material having an increased length to provide a higher sheet resistance, or a resistive material having an increased width to provide a lower sheet resistance, were disposed between the conductive wiring layers.

This, however, would cause another problem that the thick film circuit board will have an increased area.

SUMMARY OF THE INVENTION

An object of the present invention is to provide a miniaturized thick film circuit board having a thick film structure which can be stably mass-produced with a high production yield and high quality.

Another object of the present invention is to provide a thick film circuit board having a thick film structure in which cracking does not occur in the conductor wiring layer even when a lanthanum boride-based resistive material having a low sheet resistance of about 10 to $50\Omega$/square is used to form a thick film resistance layer.

A further object of the present invention is to provide a thick film circuit board having a thick film structure in which the resistive material does not fluctuate in sheet resistance even when a lanthanum boride-based resistive material having a high sheet resistance of 5 to $6\Omega$/square or more is used to form a thick film resistance layer.

To achieved the object according to the present invention, there is provided a thick film circuit board comprising:

an insulating substrate;

conductor wiring layers of a conductive material containing an oxide and formed on the insulating substrate by printing and firing;

a resistance layer of a resistive material having a selected sheet resistance, being chemically reactive with the oxide, and formed between and bridging the conductor wiring layers by printing and firing; and a conductive barrier layer interposed between each of the conductor wiring layers and the resistance layer to prevent chemical reaction between the oxide of the conductor wiring layers and the resistive material of the resistance layer.

According to the present invention, a resistive material having a desired sheet resistance can be formed on a conductor wiring layer by printing and firing while preventing chemical reaction between the resistive material and an oxide in the conductive material of the conductor wiring layer, so that a thick film circuit board is stably produced while ensuring good conductivity of the conductor wiring layer, irrespective of either the composition and sheet resistance of the resistive material or the material Of the conductor wiring layer. The thick film structure of the present invention also provides a significant improvement in the production yield and mass-producibility.

According to the first aspect of the present invention, the chemical reaction is typically a reduction of the oxide by the resistive material and the barrier layer covers the conductor wiring layers at least in a portion where a peripheral portion of the resistance layer is engaged with the conductor wiring layers.

The first aspect of the present invention ensures prevention of the cracking which would otherwise occur in the conductor wiring layer in a portion with which a peripheral portion of the resistance layer is engaged, because of diffusion of oxides into the conductor wiring layer due to reduction of the oxides by the resistive material. The barrier layer can be disposed in a small area and does not substantially affect the sheet resistance of the resistance layer.

According to a preferred embodiment of the first aspect of the present invention, the barrier layer may be formed of any usual resistive material having any sheet resistance, although it can be formed by plating or vapor deposition of a pure metal in accordance with the material of the conductor wiring layer.

According to a further preferred embodiment of the first aspect of the present invention, the barrier layer is advantageously formed of the same resistive material as that of the resistors in the thick film circuit board, so that the barrier layer can be formed without the need for increasing the process steps and the kinds of materials for producing the thick film circuit board.

According to a preferred embodiment of the first aspect of the present invention, the insulating substrate is composed of a ceramic substrate and the conductor wiring layer is composed of a copper conductor wiring layer, thereby providing a miniaturized thick film circuit board having a high temperature endurance, in which the resistance layer of the resistive material having the selected sheet resistance is most preferably composed of a lanthanum boride ($LaB_6$)-based resistive material.

In this embodiment, the second resistive material forming the barrier layer is also preferably composed of a lanthanum boride-based resistive material because the thick film structure can be efficiently formed without the need for increasing the number of the process steps and the kinds of material for producing the thick film circuit board.

In this case, cracking of the conductor wiring layer can be prevented even when the thick film resistance layer is composed of a lanthanum boride-based resistive material having a low sheet resistance of, for example, about 10 to 50$\Omega$/square, according to a preferred embodiment in which the resistive material having the selective sheet resistance contains a relatively large amount of a lanthanum boride-based conductor component and has a relatively low sheet resistance and the second resistive material forming the barrier layer contains a relatively small amount of the lanthanum boride-based conductor component and has a relatively high sheet resistance.

More specifically, the experiments conducted by the present inventors showed that either the cracking of the conductor wiring layer or the fluctuation of the resistance does not occur if the barrier layer is composed of a resistive material having a sheet resistance of 60$\Omega$/square or more and less than 5 k$\Omega$/square, according to a preferred embodiment of the present invention, in which the resistive material of the resistance layer having the selected sheet resistance has a sheet resistance of from 10$\Omega$/square to 50$\Omega$/square and the second resistive material forming the barrier layer has a sheet resistance between 60$\Omega$/square and 5$\Omega$/square.

According to the second aspect of the present invention, the chemical reaction typically produces an insulating material producing a reaction between the resistive material of the resistance layer and the oxide in the conductor wiring. The barrier layer is disposed over a part of a contacting surface between each of the conductor wiring layers and the resistance layer to prevent the reaction.

The second aspect of the present invention ensures decreased amount of the insulating material generated as the product of the reaction between the resistive material and the oxides and a decreased deviation of the actual resistance from the required resistance of the barrier layer with a small amount of the material necessary to form the barrier layer.

According to a preferred embodiment of the second aspect of the present invention, the barrier layer is formed of a second resistive material having a sheet resistance different from that of the resistive material of the resistance layer. Preferably, the second resistance material is a resistive material forming resistors on the thick film circuit board.

According to another preferred embodiment of the second aspect of the present invention, the insulating substrate is a ceramic substrate, the conductor wiring layers are copper conductor wiring layers, the resistive material of the resistance layer having the selected sheet resistance and the second resistive material of the barrier layer are lanthanum boride-based resistive materials.

According to yet another preferred embodiment of the second aspect of the present invention, the insulating substrate is a ceramic substrate, the conductor wiring layers are copper conductor wiring layers, the resistive material of the resistance layer having the selected sheet resistance and the second resistive material of the barrier layer are lanthanum boride-based resistive materials. More preferably, the resistive material of the resistance layer having the selected sheet resistance is chemically reactive with the copper conductor wiring layers and has a relatively high sheet resistance and the second resistive material forming the barrier layer is chemically nonreactive with the copper conductor wiring layers and has a relatively low sheet resistance.

This embodiment advantageously provides a thick film circuit board in which fluctuation of the resistance of the thick film resistance layer is prevented even when it is composed of a lanthanum boride-based resistive material having a sheet resistance of, for example, 5 to 6 k$\Omega$/square or more.

More specifically, the experiments conducted by the present inventors showed that, according to a preferred embodiment of the present invention, the resistive material of the resistance layer having the selected sheet resistance has a sheet resistance of from 5 k$\Omega$/square to 10 k$\Omega$/square and the second resistive material forming the barrier layer has a sheet resistance of 60$\Omega$/square or more and less than 5 k$\Omega$/square, to prevent substantial fluctuation of the resistance and the cracking of the conductor wiring layer.

According to a further aspect of the present invention, the thick film circuit board typically forms a part of a built-in IC igniter of an ignition coil mounted on an internal combustion engine.

According to yet another aspect of the present invention, there is provided a thick film circuit board comprising:
- an insulating substrate;
- conductor wiring layers formed on the insulating substrate by printing and firing;
- a resistance layer of a resistive material having a selected sheet resistance formed between the conductor wiring layers by printing and firing; and
- a conductive barrier layer disposed between the conductor wiring layers and the resistance layer.

DESCRIPTION OF THE PREFERRED EMBODIMENTS

EXAMPLE 1

Figure 1:
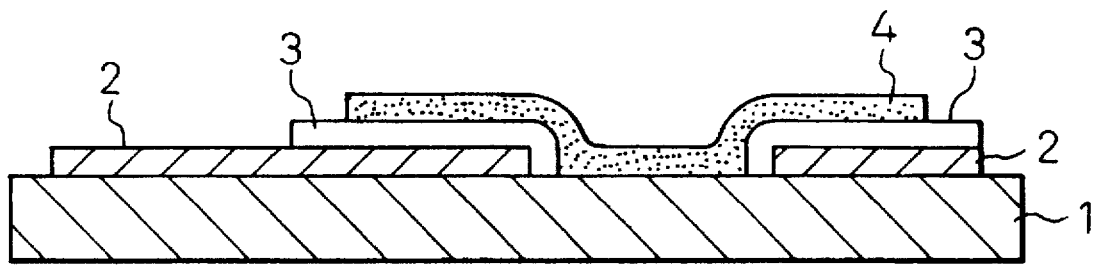
FIG. 1 is a cross-sectional view showing a thick film circuit board according to the present invention.

FIG. 1 is a cross-sectional view showing a thick film circuit board according to an embodiment of the present invention.

The thick film circuit board of Example 1 is suitably used as an HIC substrate of a built-in IC igniter of an ignition coil mounted on an internal combustion engine and is subjected to severe temperature conditions, and therefore, has a copper conductor wiring layer, which has good bond strength at high temperatures, a high temperature endurance, and a low resistivity which enables high density wiring and miniaturization of the circuit board.

The thick film circuit board of FIG. 1 is sequentially composed of an alumina substrate 1 having copper conductor wiring layers 2 formed thereon by printing and firing, barrier layers 3 of a lanthanum boride ($LaB_6$)-based resistive material (as a second resistive material) formed on the wiring layers 2 in the terminal portions, and a resistance layer 4 of a lanthanum boride-base resistive material having a desired sheet resistance. The resistance layer 4 bridges the wiring layers 2 via the barrier layer 3 so that it extends from the upper surface of one of the barrier layers 3 via the upper surface of the substrate 1 in the region between the wiring layers 2 to the upper surface of the other of the barrier layers 3.

In Example 1, the resistance layer 4 is formed of a resistive material having a low sheet resistance of about 10 to 50Ω/square and the second resistive material forming the barrier layers 3 has a high sheet resistance of 60Ω/square or more.

As herein mentioned before, in the conventional thick film circuit board having no barrier layer like the barrier layers 3 in the invention, the use of the resistance layer 4 having the low resistance of about 10 to 50Ω/square caused cracking of the copper conductor wiring layers 2. However, in the thick film circuit board of FIG. 1 according to the present invention, the cracking of the copper conductor wiring layer 2 is prevented by the provision of the barrier layer 3 of the second resistive material having the sheet resistance of 60Ω/square or more interposed between the copper conductor wiring layer 2 and the resistance layer 4.

This is thought to be because the reducing action of the resistive material of the resistance layer 4, which has the low sheet resistance of about 10 to 50Ω/square due to a large content of a lanthanum boride-based conductive component, is suppressed by the barrier layer 3 of the second resistive material having the high sheet resistance of 60Ω/square or more due to a small content of a lanthanum boride-based conductive component.

In fact, the present inventors produced a conventional thick film circuit board and a present inventive thick film circuit board of FIG. 1 and compared the properties thereof in the following way.

Figure 2:
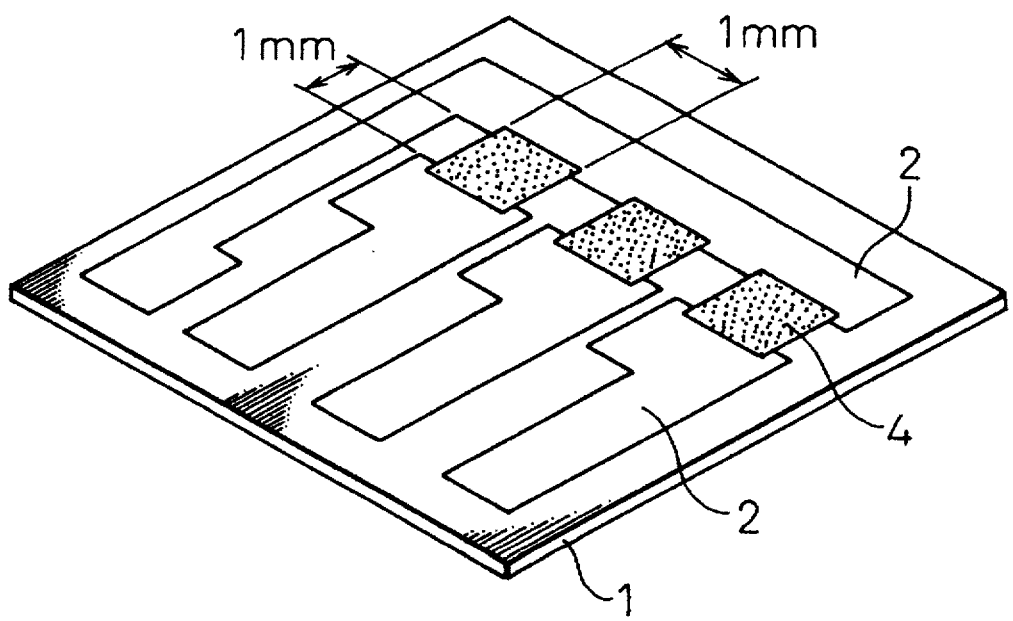
FIG. 2 is a perspective view showing a pattern of conductor wiring and resistance layers of a thick film circuit board according to the present invention.

A sample production includes printing, on a 96% alumina substrate 1 having a dimension of 25.4 mm×25.4 mm and a thickness of 0.8 mm, a copper conductor paste ("Cu Paste 9922" commercially available from Dupont) in the pattern shown in FIG. 2, firing the substrate 1 having the paste pattern to form copper conductor wiring layers 2, and then forming a thick film resistance layer 4 of a lanthanum boride ($LaB_6$)-based resistive material having a sheet resistance of 10Ω/square by printing and firing Dupont Resistance Paste QP601 to a dimension of 1 mm×1 mm in a space between the wiring layers 2.

More specifically, the process was performed in the following sequence.

(1) The copper conductor paste was screen-printed on the alumina substrate 1, which was then dried in air at 120° C. for 10 minutes to form a 22 μm thick coating.

(2) The substrate 1 was then fired in a belt conveyer furnace in a nitrogen gas atmosphere having an oxygen concentration of 5 ppm at 900° C. for 10 minutes.

Thus, 63 initial circuit boards composed of an aluminum substrate 1 having a copper conductor wiring layer 2 formed thereon were produced and divided into three groups A, B, and C each including 21 boards.

The initial boards of Groups A, B, and C were then coated with resistive materials in three different ways to produce the following three groups of samples of the conventional or present inventive thick film circuit boards, each group including 21 samples.

Group A (Samples A1–A21: conventional boards)

Figure 3A:
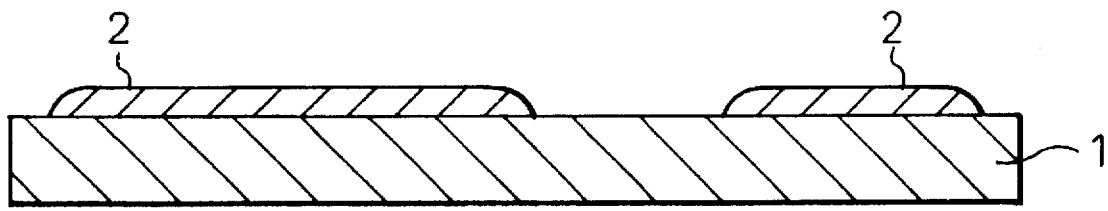
FIGS. 3(a) and 3(b) are cross-sectional views showing a process sequence for producing a conventional thick film circuit board.
Figure 3B:
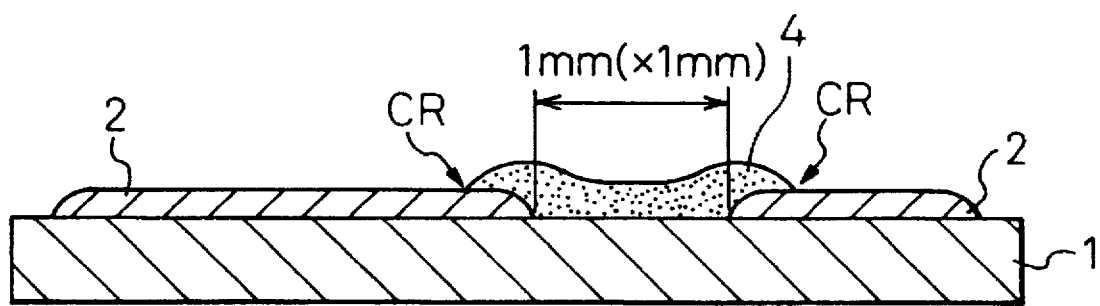

On an alumina substrate 1 shown in FIG. 3(a) having a copper conductor wiring layers 2 formed thereon, a 10Ω/square lanthanum boride-based resistance paste 4 was screen-printed in a space between the copper conductor wiring layers 2 to cover the layers 2 in the peripheral region as shown in FIG. 3(b). The substrate 1 having the paste printed thereon was dried in air at 120° C. for 10 minutes to form a coating 41 having a thickness of 25 μm and was then fired in a furnace under a nitrogen gas atmosphere having an oxygen concentration of 5 ppm at 900° C. for 10 minutes.

This produced a conventional thick film circuit board in which the resistance layer 4 is provided on the substrate 1 in the portion between the copper conductor wiring layers 2 and bridges the layers 2 by being directly engaged with the peripheral portions of the layers 2 as shown in FIG. 3(b).

Group B (Samples B1–B21: inventive boards)

Figure 4A:
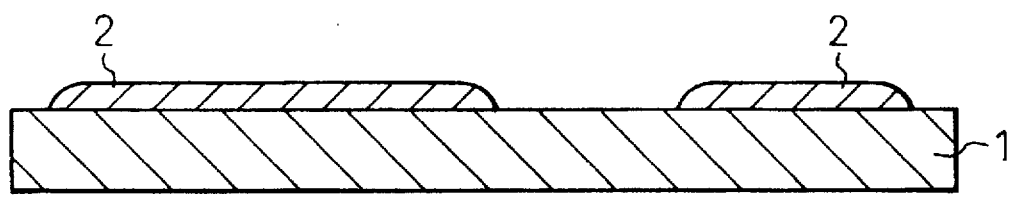
FIGS. 4(a) to 4(c) are cross-sectional views showing a process sequence for producing a thick film circuit board of Example 1 according to the present invention.
Figure 4B:
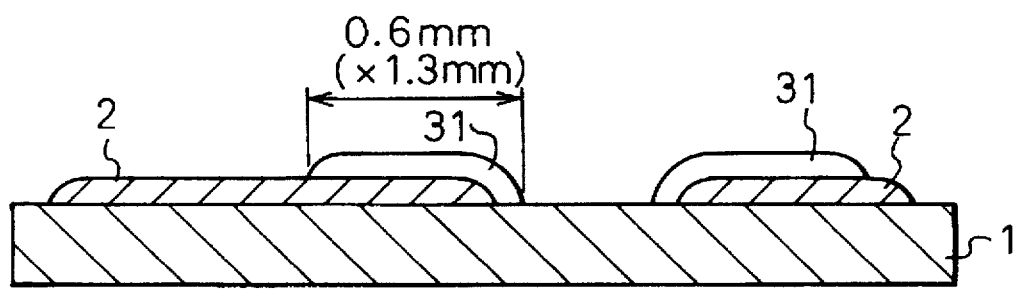
Figure 4C:
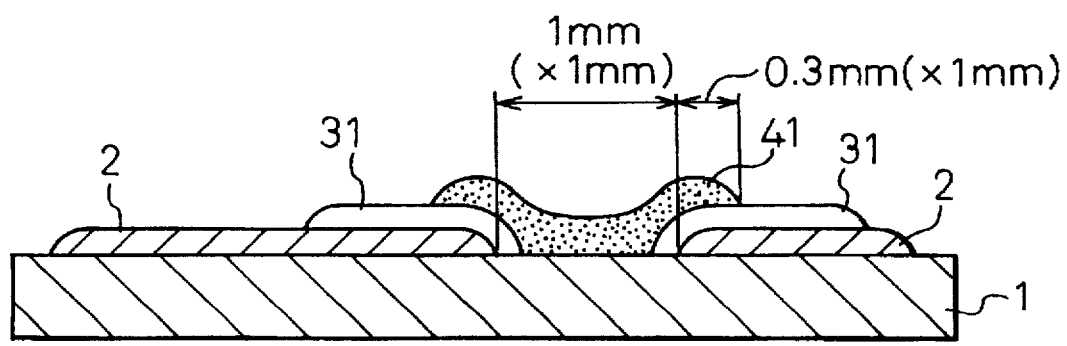

On an alumina substrate 1 shown in FIG. 4(a) having a copper conductor wiring layers 2 formed thereon, a 100Ω/square lanthanum boride (LaB$_6$)-based resistance paste (Dupont Resistance Paste QP602) was screen-printed in an area of 0.6 mm×1.3 mm in the peripheral region of each of the wiring layers 2 including the side walls as shown in FIG. 4(b). The substrate 1 having the paste printed thereon was then dried in air at 120° C. for 10 minutes to form a coating 31 of a barrier layer resistive material having a thickness of 25 μm. The same 10Ω/square lanthanum boride-based resistive material paste as used in Group A was further screen-printed on the substrate 1 in a space between the wiring layers 2 to cover the layers 2 in the peripheral portion including the side walls as shown in FIG. 4(c). The substrate 1 was dried in air at 120° C. for 10 minutes to form a coating 41 of a resistive material having a thickness of 25 μm. The substrate 1 having the wiring layers 2 and the printed and dried coatings 31 and 41 was finally fired in a furnace under a nitrogen gas atmosphere having an oxygen concentration of 5 ppm at 900° C. for 10 minutes.

This produced a thick film circuit board according to the present invention, in which the resistance layer 41 is provided on the substrate 1 in the portion between the copper conductor wiring layers 2 and bridges the layers 2 by being indirectly engaged with the peripheral portions of the layers 2 via the barrier layers 31 as shown in FIG. 4(c).

Group C (Samples C1–C21: inventive boards)

Figure 5A:
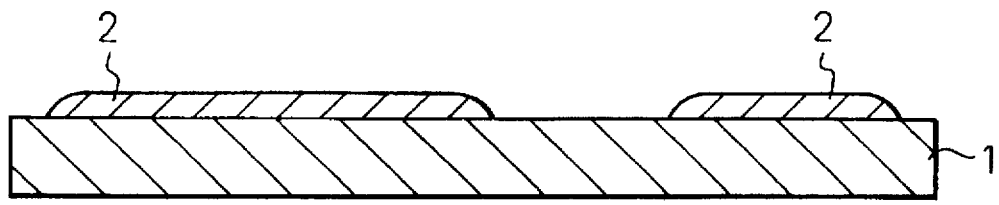
FIGS. 5(a) to 5(c) are cross-sectional views showing a process sequence for producing another thick film circuit board of Example 1 according to the present invention.
Figure 5B:
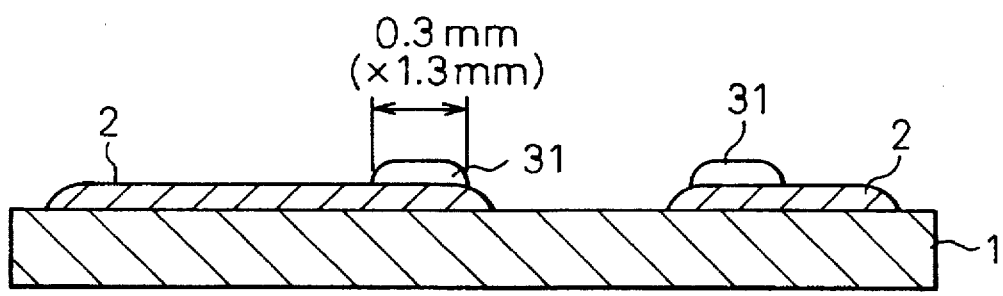
Figure 5C:
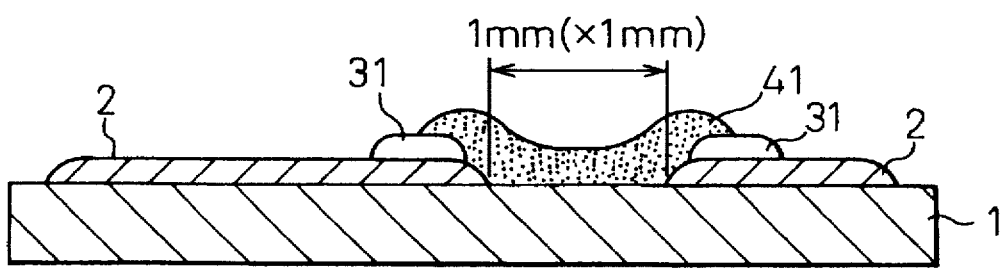

On an alumina substrate 1 shown in FIG. 5(a) having a copper conductor wiring layers 2 formed thereon, the same 100Ω/square lanthanum boride (LaB$_6$)-based resistance paste as used in Group B was screen-printed in an area of 0.3 mm×1.3 mm in the peripheral region of each of the wiring layers 2 except for the side walls as shown in FIG. 5(b). The substrate 1 having the paste printed thereon was then dried in air at 120° C. for 10 minutes to form a coating 31 of a barrier layer resistive material having a thickness of 25 μm. The same 10Ω/square lanthanum boride-based resistive material paste as used in Group A was further screen-printed on the substrate 1 in a space between the wiring layers 2 to cover the layers 2 in the peripheral region including the side walls as shown in FIG. 5(c). The substrate 1 was dried in air at 120° C. for 10 minutes to form a coating 41 of a resistive material having a thickness of 25 μm. The substrate 1 having the wiring layers 2 and the printed and dried coatings 31 and 41 was finally fired in a furnace under a nitrogen gas atmosphere having an oxygen concentration of 5 ppm at 900° C. for 10 minutes.

This produced a thick film circuit board according to the present invention, in which the resistance layer 41 is provided on the substrate 1 in the portion between the copper conductor wiring layers 2 and bridges the layers 2 by being partially directly and partially indirectly engaged with the peripheral portions of the layers 2 via the barrier layers 31 as shown in FIG. 5(c).

Table 1 summarizes the resistance data of the above-produced samples measured by a digital multimeter.

As can be seen from Table 1, in Samples A1 to A21 of Group A having the conventional structure, the thick film resistance layer 4 had an average resistance of 5.5 kΩ, which was far greater than a target resistance of 10Ω, and the resistance fluctuation Cv was as large as 406%, including two abnormal values among twenty one data points. The fluctuation was calculated by the formula: Cv=[Standard Deviation σ (n–1)]/[Average Value].

Microscopy was conducted to observe the cross section of Samples A1 to A21 and many cracks were observed in the copper conductor wiring layers 2.

In contrast, Table 1 also shows that, in Samples B1 to B21 of Group B and Samples C1 to C21 of Group C both according to the present invention, the thick film resistance layer 41 had an average resistance of 8.33Ω for Group B and 11.87Ω for Group C, which both substantially corresponded to the target resistance of 10Ω. The resistance fluctuation Cv were 6.2% for Group B and 5.32% for Group C, which both were practically acceptable.

Microscopy was also conducted and no cracks were observed in the copper conductor wiring layers 2 for all of the Samples B1 to B21 and C1 to C21.

These results clarify that, according to the present invention, cracking of the copper conductive wiring layer does not occur in a thick film circuit board even if it is provided with a thick film resistance layer of a lanthanum boride-based resistive material having a low sheet resistance of about 10 to 50Ω/square which unavoidably caused the cracking of the copper conductive wiring layer in the conventional thick film circuit board, and that the prevention of the cracking is achieved by the provision of the barrier layer 31 interposed between the copper conductor wiring layer and the resistance layer according to the present invention.

Another experiment showed that the barrier layer 31 more advantageously prevents the occurrence of the cracking when it has a sheet resistance of 60Ω/square or more (or 50Ω/square or more in terms a blended resistance with the resistance layer 41).

It can be also seen from Table 1 that the provision of the interposed barrier layer 31 of a resistive material stabilizes the resistance of the thick film resistance layer 41 ensuring a precise resistance.

It should be also noted that it is only necessary for the barrier layer 31 to cover at least the peripheral portion of the copper conductor wiring layer 2 that is engaged with the resistance layer 41, because both Groups B and C provide good resistance properties to the thick film circuit board.

In the conventional boards, cracking occurred in the copper conductor wiring layer 2 at a boundary denoted by an arrow "CR" defined by the fringe or front line of the resistance layer 4 on the copper conductor wiring layer 2. Therefore, as shown in FIG. 5(c), in Samples C1 to C21 of Group C, the barrier layer 31 is disposed so as to cover the copper conductor wiring layer 2 at least in the portion in which a boundary would otherwise be formed between the fringe of the resistance layer 41 and the underlying copper conductor wiring layer 2. As can also be seen from the above-described results including the data in Table 1, it is proved that the provision of the barrier layer 31 in a form such as typically shown in FIG. 5(c) advantageously prevents the cracking of the copper conductor wiring layer 2 and also provides a precise resistance.

It should be also noted that the structure of Group C has a reduced area occupied by the barrier layer 31 enabling reduction of the influence of the barrier layer 31 on the resistance of the thick film resistance layer 41.

In Samples C1 to C21 of Group C, the barrier layer 31 has a width of 0.3 mm which is determined from an allowable misalignment in screen printing on the substrate 1, or 0.1 mm in this case.

EXAMPLE 2

A thick film circuit board according to another embodiment of the present invention will be described below.

The thick film circuit board of Example 2 is suitably applied to the same use as in Example 1 and has substantially the same cross-sectional structure as shown in FIG. 1. Namely, the thick film circuit board of Example 2 is sequentially composed of an alumina substrate 1 having copper conductor wiring layers 2 formed thereon by printing and firing, barrier layers 3 of a lanthanum boride ($LaB_6$)-based resistive material (as a second resistive material) formed on the wiring layers 2 in the terminal portions, and a resistance layer 4 of a lanthanum boride-base resistive material having a desired sheet resistance. The resistance layer 4 bridges the wiring layers 2 via the barrier layer 3 so that it extends from the upper surface of one of the barrier layers 3 via the upper surface of the substrate 1 in the region between the wiring layers 2 to the upper surface of the other of the barrier layers 3.

In Example 2, the resistance layer 4 is formed of a resistive material having a relatively high sheet resistance of 5 k$\Omega$/square to 6 k$\Omega$/square or more and the second resistive material forming the barrier layers 3 has a lower sheet resistance than the resistance layer 4.

As herein mentioned before, in the conventional thick film circuit board having no barrier layer like the layers 3 of the invention, the resistance layer 4 having a high resistance of 5 k$\Omega$/square to 6 k$\Omega$/square or more unavoidably fluctuates in resistance too much to be practically acceptable. However, in the thick film circuit board of Example 2 according to the present invention, the fluctuation in resistance of the resistance layer 4 is prevented by interposing the barrier layer 3 of the second resistive material having a sheet resistance lower than that of the resistance layer 4, between the copper conductor wiring layer 2 and the resistance layer 4.

This is thought to be because the formation of an insulating phase due to the chemical reaction between the resistance layer 4 of a lanthanum boride-based resistive material, which has a sheet resistance of 5 k$\Omega$/square to 6 k$\Omega$/square or more and the copper conductor wiring layer 2, is suppressed by the interposed barrier layer 3 of a lanthanum boride-based resistive material (or the second resistive material) having a sheet resistance lower than that of the resistance layer 4.

In fact, the present inventors produced a conventional thick film circuit board and a present inventive thick film circuit board of Example 2 and compared the properties thereof in the following way.

The sample production includes printing, on a 96% alumina substrate 1 having a dimension of 25.4 mm×25.4 mm and a thickness of 0.8 mm, a copper conductor paste ("Cu Paste 9922" commercially available from Dupont) in the same pattern as shown in FIG. 2, firing the substrate 1 having the paste pattern to form copper conductor wiring layers 2, and then forming a thick film resistance layer 4 of a lanthanum boride ($LaB_6$)-based resistive material having a sheet resistance of 10$\Omega$/square by printing and firing Dupont Resistance Paste QP601 to a dimension of 1 mm×1 mm in a space between the wiring layers 2.

More specifically, the process was performed in the following sequence.

(1) The copper conductor paste was screen-printed on the alumina substrate 1, which was then dried in air at 120° C. for 10 minutes to form a 22 µm thick coating.

(2) The substrate 1 was then fired in a belt conveyer furnace in a nitrogen gas atmosphere having an oxygen concentration of 5 ppm at 900° C. for 10 minutes.

Thus, 42 initial circuit boards composed of an alumina substrate 1 having a copper conductor wiring layer 2 formed thereon were produced and divided into two groups D and E each including 21 boards.

The initial boards of Groups D and E were then coated with resistive materials in two different ways to produce the following two groups of samples of the conventional or present inventive thick film circuit boards, each group including 21 samples.

Group D (Samples D1–D21: conventional boards)

Figure 6A:
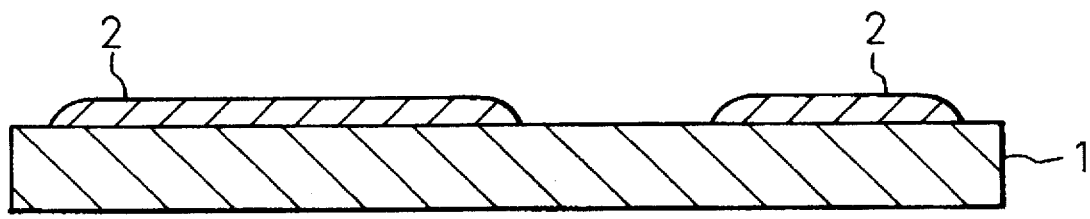
FIGS. 6(a) and 6(b) are cross-sectional views showing a process sequence for producing another conventional thick film circuit board.
Figure 6B:
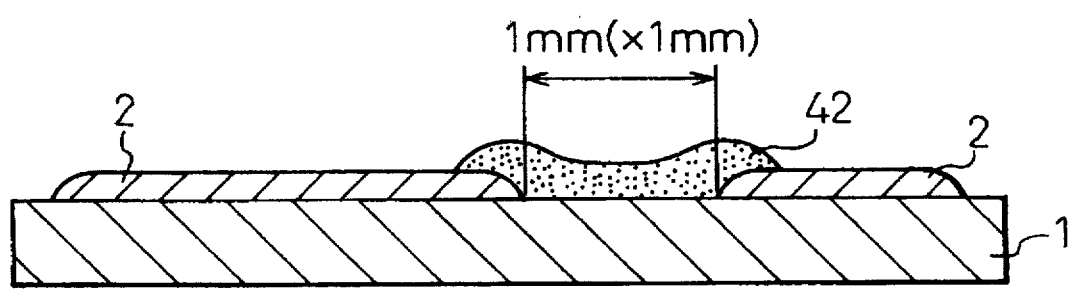

On an alumina substrate 1, as shown in FIG. 6(a), having copper conductor wiring layers 2 formed thereon, a 10 k$\Omega$/square lanthanum boride-based resistance paste 42 was screen-printed in a space between the copper conductor wiring layers 2 to cover the layers 2 in the peripheral region as shown in FIG. 6(b). The substrate 1 having the paste printed thereon was dried in air at 120° C. for 10 minutes to form a coating 42 having a thickness of 25 µm and was then fired in a furnace in a nitrogen gas atmosphere having an oxygen concentration of 5 ppm at 900° C. for 10 minutes.

This produced a conventional thick film circuit board in which the resistance layer 42 is provided on the substrate 1 in the portion between the copper conductor wiring layers 2 and bridges the layers 2 by being directly engaged with the peripheral portions of the layers 2 as shown in FIG. 6(b).

Group E (Samples E1–E21: inventive boards)

Figure 7A:
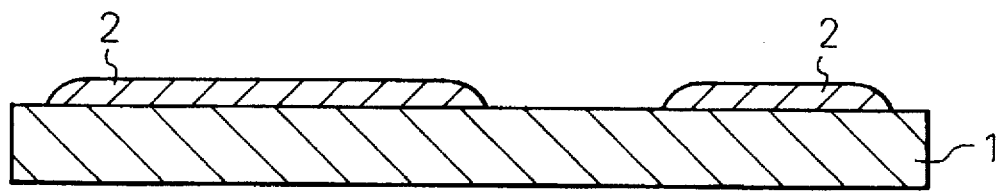
FIGS. 7(a) to 7(c) are cross-sectional views showing a process sequence for producing a thick film circuit board of Example 2 according to the present invention.
Figure 7B:
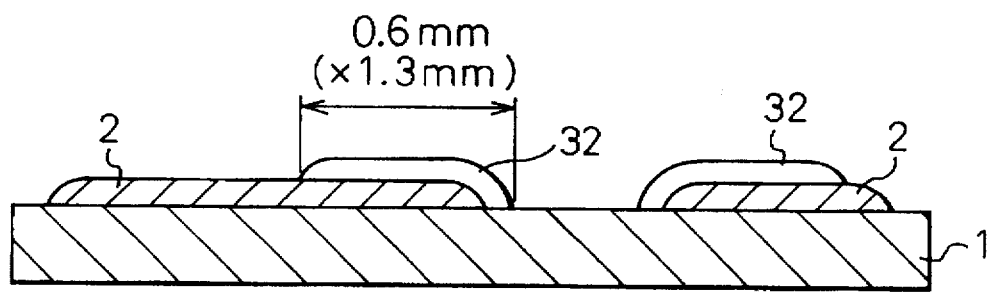
Figure 7C:
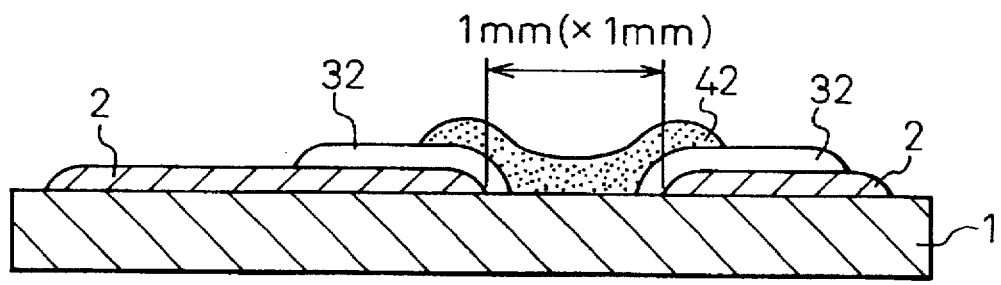

On an alumina substrate 1, as shown in FIG. 7(a), having a copper conductor wiring layers 2 formed thereon, a 1 k$\Omega$/square lanthanum boride ($LaB_6$)-based resistance paste (Dupont Resistance Paste QP603) was screen-printed in an area of 0.6 mm×1.3 mm in the peripheral region of each of the wiring layers 2 including the side walls as shown in FIG. 7(b). The substrate 1 having the paste printed thereon was then dried in air at 120° C. for 10 minutes to form a coating 32 of a barrier layer resistive material having a thickness of 25 µm. The same 10 k$\Omega$/square lanthanum boride-based resistive material paste as used in Group D was further screen-printed on the substrate 1 in a space between the wiring layers 2 to cover the layers 2 in the peripheral portion including the side walls as shown in FIG. 7(c). The substrate 1 was dried in air at 120° C. for 10 minutes to form a coating 42 of a resistive material having a thickness of 25 µm. The substrate 1 having the wiring layers 2 and the printed and dried coatings 32 and 42 was finally fired in a furnace in a nitrogen gas atmosphere having an oxygen concentration of 5 ppm at 900° C. for 10 minutes.

This produced a thick film circuit board according to the present invention, in which the resistance layer 42 is provided on the substrate 1 in the portion between the copper conductor wiring layers 2 and bridges the layers 2 by being indirectly engaged with the peripheral portions of the layers 2 via the barrier layers 32 as shown in FIG. 7(c).

Table 2 summarizes the resistance data of the above-produced samples measured by a digital multimeter.

As can be seen from Table 2, in Samples D1 to D21 of Group D having the conventional structure, the thick film resistance layer 42 had an average resistance of 18.8 k$\Omega$, which was greater than a target resistance of 10 k$\Omega$, and the resistance fluctuation Cv was as large as 24.7%.

In contrast, Table 2 also shows that, in Samples E1 to E21 of Group E according to the present invention, the thick film resistance layer 42 had an average resistance of 12.6 kΩ, which substantially corresponded to the target resistance of 10 kΩ. The resistance fluctuation Cv was 4.9%, which was practically acceptable.

Microscopy was conducted and no cracks were observed in the copper conductor wiring layers 2 for all of the Samples D1 to D21 and E1 to E21.

These results indicate that, according to the present invention, the fluctuation in resistance of the thick film resistance layer 42 is advantageously prevented even if it is formed of a lanthanum boride-based resistive material having a high sheet resistance of 5 kΩ/square to 6 kΩ/square or more which unavoidably caused the fluctuation in resistance of the resistance layer in the conventional thick film circuit board, and that the prevention of the fluctuation in resistance is achieved by the provision of the barrier layer 32 interposed between the copper conductor wiring layer and the resistance layer according to the present invention.

Another experiment showed that the barrier layer 32 more advantageously prevents the fluctuation of resistance when it has a sheet resistance of less than 5 kΩ/square (but not less than 60Ω/square to prevent the occurrence of cracking of the copper conductor wiring layer 2).

Although it may be thought that the additional provision of the barrier layer 3, 31, or 32 would require an increased number of the process steps or materials, the thick film circuit boards described in Examples 1 and 2 can actually be produced causing no increase in production costs. This is because resistive materials having various sheet resistances are usually used in the production of this kind of thick film circuit boards.

Specifically, in a process step of applying a resistive material having a sheet resistance of 60Ω/square or more to some regions on the substrate 1, this resistive material can also be applied to the peripheral portions of the copper conductor wiring layer 2 in the same step to form a barrier layer 31 as shown in FIGS. 4(b) or 5(b), and thereafter, a resistive material having a sheet resistance of about 10 to 50Ω/square is applied to the same peripheral portions in a later step to form a resistance layer 41 as shown in FIGS. 4(c) or 5(c).

Similarly, in the peripheral portions of the copper conductor wiring layer 2 to which a resistive material having a sheet resistance of 5 to 6 kΩ/square or more is to be applied, a resistive material having a lower sheet resistance (but not lower than 60Ω/square to prevent the cracking) is applied to the peripheral portions in a process step of applying the latter resistive material having the lower sheet resistance to some other regions on the substrate 1 as shown in FIG. 7(b), and thereafter, the former resistive material having the sheet resistance of 5 to 6 kΩ/square or more is applied to the same peripheral portions in a later step to form a resistance layer 42 as shown in FIG. 7(c).

This enables the barrier layer 3, 31, or 32 to be formed without a substantial increase in production cost.

Any possible process sequence can be used to form the barrier layer 3, 31, or 32 and the thick film resistance layer 4, 41/or 42, although Examples 1 and 2 formed both layers in a single firing step. Namely, these layers may be formed in the separate firing steps such that the barrier layer 3, 31, or 32 is first coated, dried and fired and the thick film resistance layer 4, 41 or 42 is then coated, dried and fired. This process sequence also provides the same advantageous effect of the provision of the barrier layer 3, 31, or 32 as obtained when the barrier layer is formed by a single firing.

Although the barrier layer 3, 31, or 32 is only provided in the peripheral portions of the copper conductor wiring layers 2 in Examples 1 and 2, the barrier layer may also be provided so that it bridges the peripheral portions of the copper conductor wiring layers 2, if this form of provision does not substantially affect the resistance value of the overlying thick film resistance layer 4, 41 or 42.

The barrier layer 3, 31, or 32 is not necessarily be composed of a single layer. In accordance with the need to commonly use various resistive materials as the barrier layer, the barrier layer may advantageously be formed as a lamination of two or more resistive materials having either the same or different sheet resistance values, if the first layer directly coated on the copper conductor wiring layer 2 has a sheet resistance satisfying the relationship with the overlying resistance layer 4, 41, or 42.

It should be also noted that the barrier layer 3, 31, or 32 is not necessarily formed of a resistive material. For example, when the conductor wiring is composed of a copper conductor as described above, the barrier layer may be formed by plating or vapor deposition of a pure metal such as copper plating, copper vapor deposition, nickel plating, etc. These types of barrier layers are also advantageously used to prevent the occurrence of cracking and to suppress the fluctuation of resistance.

Although an alumina substrate 1 and a copper conductor wiring layer 2 are described in Examples 1 and 2, the substrate 1 and the conductor wiring layer 2 need not necessarily be composed of alumina and copper, respectively, but may be composed of other materials.

The present invention can advantageously be applied evenly to all of the thick film circuit boards having a structure composed of an insulating substrate, a conductor wiring layers formed on the substrate by printing and firing, and a resistance layer provided between and connecting the conductor wiring layers.

Although Examples 1 and 2 describe circuit boards which are suitably applied to an IC igniter mounted on an internal combustion engine, the present invention is not limited to this application but is also advantageously used in many other applications, such as a circuit board of ECU or other parts, including those having no relationship to internal combustion engines.

As herein described above, the present invention provides a thick film circuit board having stable performance, good mass-producibility, and high production yield, in which no cracks occurs in the conductor wiring layer even when the thick film resistance layer is composed of a lanthanum boride-based resistive material having a low sheet resistance 10 to 50Ω/square, and in which the fluctuation of resistance is suppressed even when the thick film resistance layer is composed of a lanthanum boride-based resistive material having a high sheet resistance of 5 to 6Ω/square or more.

TABLE 1

| Sample No. | A1–A21 | B1–B21 | C1–C21 |
|---|---|---|---|
| Resistance layer material | $LaB_6$-based 10 Ω/square (QP601) | $LaB_6$-based 10 Ω/square (QP601) | $LaB_6$-based 10 Ω/square (QP601) |
| Barrier layer material | — | $LaB_6$-based 100 Ω/square (QP602) | $LaB_6$-based 100 Ω/square (QP602) |
| Barrier layer dimension | — | 0.6 × 1.3 mm | 0.3 × 1.3 mm |

TABLE 1-continued

| Sample No. | A1–A21 | B1–B21 | C1–C21 |
|---|---|---|---|
| Resistance | 5.5 kΩ | 8.33 Ω | 11.87 Ω |
| Fluctuation | 406% | 6.2% | 5.32% |
| Sample number | n = 21 | n = 21 | n = 21 |

TABLE 2

| Sample No. | D1–D21 | E1–E21 |
|---|---|---|
| Resistance layer material | LaB$_6$-based 10 kΩ/square (QP604) | LaB$_6$-based 10 kΩ/square (QP604) |
| Barrier layer material | — | LaB$_6$-based 1 kΩ/square (QP603) |
| Barrier layer dimension | — | 0.6 × 1.3 mm |
| Resistance | 18.8 kΩ | 12.6 kΩ |
| Fluctuation | 24.7% | 4.9% |
| Sample number | n = 21 | n = 21 |

We claim:

1. A thick film circuit board comprising:
   an insulating substrate;
   conductor wiring layers of a conductive material containing an oxide, the conductor wiring layers being formed on the insulating substrate by printing and firing;
   a resistance layer of a resistive material having a selected sheet resistance, being chemically reactive with the oxide, and formed between the conductor wiring layers and bridging the conductor wiring layers by printing and firing; and
   a barrier layer interposed between each of the conductor wiring layers and the resistance layer to prevent chemical reaction between the oxide in the conductor wiring layers and the resistive material in the resistance layer.

2. A thick film circuit board according to claim 1, wherein the chemical reaction prevented by the barrier layer is a reduction of the oxide in the conductor wiring layers by the resistive material in the resistance layer, and wherein the barrier layer covers the conductor wiring layers at least in a portion where a peripheral portion of the resistance layer is engaged with a portion of the conductor wiring layers.

3. A thick film circuit board according to claim 2, wherein the barrier layer is a conductive barrier layer formed of a second resistive material having a sheet resistance different from a sheet resistance of the resistive material in the resistance layer.

4. A thick film circuit board according to claim 3, wherein the second resistive material in the barrier layer is a resistive material forming resistors in the thick film circuit board.

5. A thick film circuit board according to claim 4, wherein the insulating substrate is a ceramic substrate, the conductor wiring layers are copper conductor wiring layers, and the resistive material in the resistance layer having the selected sheet resistance and the second resistive material of in the barrier layer are a lanthanum boride-based resistive material.

6. A thick film circuit board according to claim 5, wherein the resistive material in the resistance layer having the selected sheet resistance contains a larger amount of a lanthanum boride-based conductor component and has a lower sheet resistance than the second resistive material forming the barrier layer.

7. A thick film circuit board according to claim 6, wherein the resistive material in the resistance layer having the selected sheet resistance has a sheet resistance of from 10Ω/square to 50Ω/square and the second resistive material forming the barrier layer has a sheet resistance between 60Ω/square and 5 kΩ/square.

8. A thick film circuit board according to claim 1, wherein the chemical reaction prevented by the banner layer is a chemical reaction producing an insulating material, the chemical reaction occurring between the resistive material in the resistance layer and the oxide in the conductor wiring layers, and wherein the barrier layer is disposed over a part of a contacting surface between each of the conductor wiring layers and the resistance layer.

9. A thick film circuit board according to claim 8, wherein the barrier layer is a conductive barrier layer formed of a second resistive material having a sheet resistance different from the sheet resistance of the resistive material in the resistance layer.

10. A thick film circuit board according to claim 9, wherein the second resistance material in the barrier layer is a resistive material forming resistors in the thick film circuit board.

11. A thick film circuit board according to claim 10, wherein the insulating substrate is a ceramic substrate, the conductor wiring layers are copper conductor wiring layers, and the resistive material in the resistance layer having the selected sheet resistance and the second resistive material in the barrier layer are a lanthanum boride-based resistive material.

12. A thick film circuit board according to claim 11, wherein the resistive material of the resistance layer having the selected sheet resistance is chemically reactive with the copper conductor wiring layers and has a higher sheet resistance than the sheet resistance of the barrier layer, and the second resistive material forming the barrier later is chemically non-reactive with the copper conductor wiring layers and has a lower sheet resistance than the sheet resistance of the resistance layer.

13. A thick film circuit board according to claim 12, wherein the resistive material of the resistance layer having the selected sheet resistance has a sheet resistance between 5 kΩ/square and 10 kΩ/square and the second resistive material forming the barrier layer has a sheet resistance between 60Ω/square and 5 kΩ/square.

14. A thick film circuit board according to claim 1, wherein the thick film circuit board is used as a part of a build-in IC igniter of an ignition coil mounted on an internal combustion engine.

* * * * *